(12) United States Patent
Minoda et al.

(10) Patent No.: US 8,842,294 B2
(45) Date of Patent: Sep. 23, 2014

(54) POSITION DETECTION APPARATUS, IMPRINT APPARATUS, AND POSITION DETECTION METHOD

(75) Inventors: Ken Minoda, Utsunomiya (JP); Yoshihiro Shiode, Utsunomiya (JP); Kazuhiko Mishima, Utsunomiya (JP); Hironori Maeda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 30 days.

(21) Appl. No.: 13/523,717

(22) Filed: Jun. 14, 2012

(65) Prior Publication Data
US 2012/0328725 A1 Dec. 27, 2012

(30) Foreign Application Priority Data
Jun. 21, 2011 (JP) .................................. 2011-137820

(51) Int. Cl.
| | |
|---|---|
| G01B 11/14 | (2006.01) |
| G03F 7/00 | (2006.01) |
| G03F 9/00 | (2006.01) |
| G01D 5/38 | (2006.01) |

(52) U.S. Cl.
CPC ............ *G03F 7/0002* (2013.01); *G03F 9/7076* (2013.01); *G03F 9/7038* (2013.01); *G03F 9/7049* (2013.01); *G01D 5/38* (2013.01); *G03F 9/7069* (2013.01)
USPC .......................................... 356/614; 356/399

(58) Field of Classification Search
CPC ..................................................... G01B 11/026
USPC .................................. 356/614–625, 399–401
See application file for complete search history.

(56) References Cited

U.S. PATENT DOCUMENTS

| | | | | |
|---|---|---|---|---|
| 5,488,230 A | * | 1/1996 | Mizutani et al. | 250/548 |
| 5,678,319 A | * | 10/1997 | Huber | 33/707 |
| 7,292,326 B2 | | 11/2007 | Nimmakayala | |
| 2004/0263860 A1 | * | 12/2004 | Johnson | 356/499 |
| 2013/0100459 A1 | * | 4/2013 | Iwai et al. | 356/499 |

* cited by examiner

*Primary Examiner* — Michael P Stafira
(74) *Attorney, Agent, or Firm* — Canon USA Inc IP Division

(57) ABSTRACT

A position detection apparatus includes an illumination optical system for illuminating a first diffraction grating having periods in each of a first direction and a second direction different from the first direction, and a second diffraction grating having a period different from the period in the second direction of the first diffraction grating in the second direction, at an oblique incidence, and a detection optical system for detecting diffracted light from the first diffraction grating and the second diffraction grating, wherein a relative position of the first diffraction grating and the second diffraction grating is detected based on the detected diffracted light, and wherein the illumination optical system includes a plurality of light intensity distributions in the first direction except for on an optical axis of the detection optical system, in a pupil plane thereof.

21 Claims, 13 Drawing Sheets

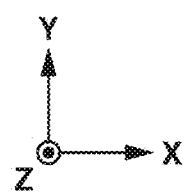

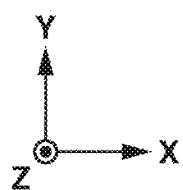

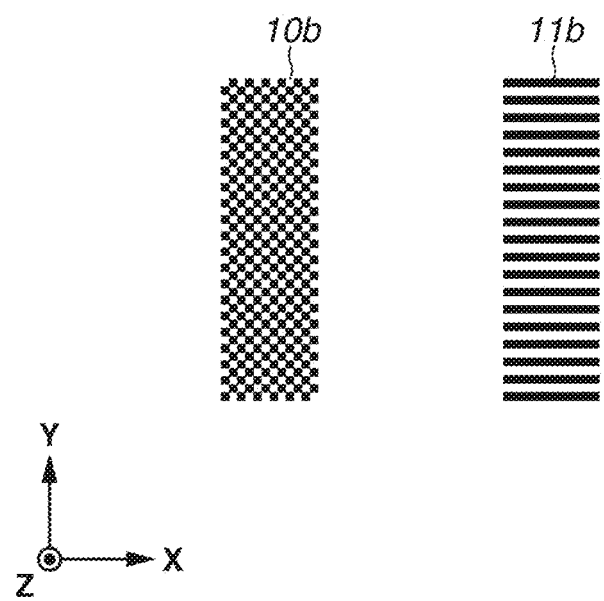

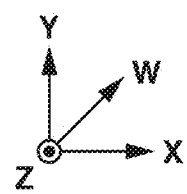

POSITION DETECTION APPARATUS, IMPRINT APPARATUS, AND POSITION DETECTION METHOD

BACKGROUND OF THE INVENTION

1. Field of the Invention

The present invention relates to a position detection apparatus which detects a relative position between two different objects, an imprint apparatus, and a position detection method.

2. Description of the Related Art

Imprint technology is technology for forming a fine pattern on a substrate by using a mold having a pattern. For example, such an imprint technology includes photo-curing method. In the imprint technology using photo-curing method, first, a resin (imprint resin, photo curable resin) which serves as an imprint material is supplied to a shot which serves as an imprint region on a substrate (wafer). The resin is cured by bringing the resin into contact with a pattern of the mold (imprinting) and radiating light while the resin and the pattern are in contact with each other. The resin pattern is formed on the substrate by separating the mold from the cured resin.

When the resin on the substrate and the mold are imprinted, it is necessary to accurately align the substrate and the mold. In order to align the substrate and the mold in the imprint apparatus, a die by die alignment is performed by detecting marks formed in the mold and marks formed in the substrate in each shot is well known.

U.S. Pat. No. 7,292,326 discusses an imprint apparatus including an alignment mark detection mechanism for detecting marks used in an alignment. As the marks used in the alignment, diffraction gratings are arranged in each of a mold and a substrate. The diffraction grating in the mold side is a diffraction grating having a period in a measurement direction, and the diffraction grating in the substrate side is a checkerboard shaped diffraction grating having periods in each of a measurement direction and a direction orthogonal to the measurement direction (a non-measurement direction). Both an illumination optical system for illuminating the diffraction gratings, and a detection optical system for detecting a diffracted light from the diffraction gratings are disposed to be inclined from a direction orthogonal to the mold and the substrate toward the non-measurement direction. That is, the illumination optical system is configured to illuminate the diffraction gratings at an oblique incidence from the non-measurement direction. The light having entered the diffraction gratings at an oblique incidence is diffracted in the non-measurement direction by the checkerboard shaped diffraction grating disposed in the substrate, and the detection optical system is disposed to detect only a single diffracted light other than a zero-order diffracted light with respect to the non-measurement direction.

That is, U.S. Pat. No. 7,292,326 discusses a method in which only a single diffracted light is detected. Accordingly, an amount of diffracted light from the diffraction grating is small, and it is difficult to detect a mark used for alignment.

SUMMARY OF THE INVENTION

The present invention is directed to allowing a mark to be easily detected by making an amount of diffracted light from the mark used in an alignment large.

According to an aspect of the present invention, a position detection apparatus includes an illumination optical system for illuminating a first diffraction grating having periods in each of a first direction and a second direction different from the first direction, and a second diffraction grating having a period different from the period in the second direction of the first diffraction grating in the second direction, at an oblique incidence, and a detection optical system for detecting diffracted light from the first diffraction grating and the second diffraction grating. A relative position of the first diffraction grating and the second diffraction grating is detected based on the detected diffracted light. The illumination optical system includes a plurality of light intensity distributions in the first direction except for on an optical axis of the detection optical system, in a pupil plane thereof.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 8A and 8B are views illustrating alignment marks in a Y-direction in the first exemplary embodiment of the present invention.

FIG. 14 is a view illustrating an imprint apparatus according to a third exemplary embodiment of the present invention.

DESCRIPTION OF THE EMBODIMENTS

Various exemplary embodiments, features, and aspects of the invention will be described in detail below with reference to the drawings.

An imprint apparatus according to the first exemplary embodiment will be described with reference to FIG. 1.

Figure 1:
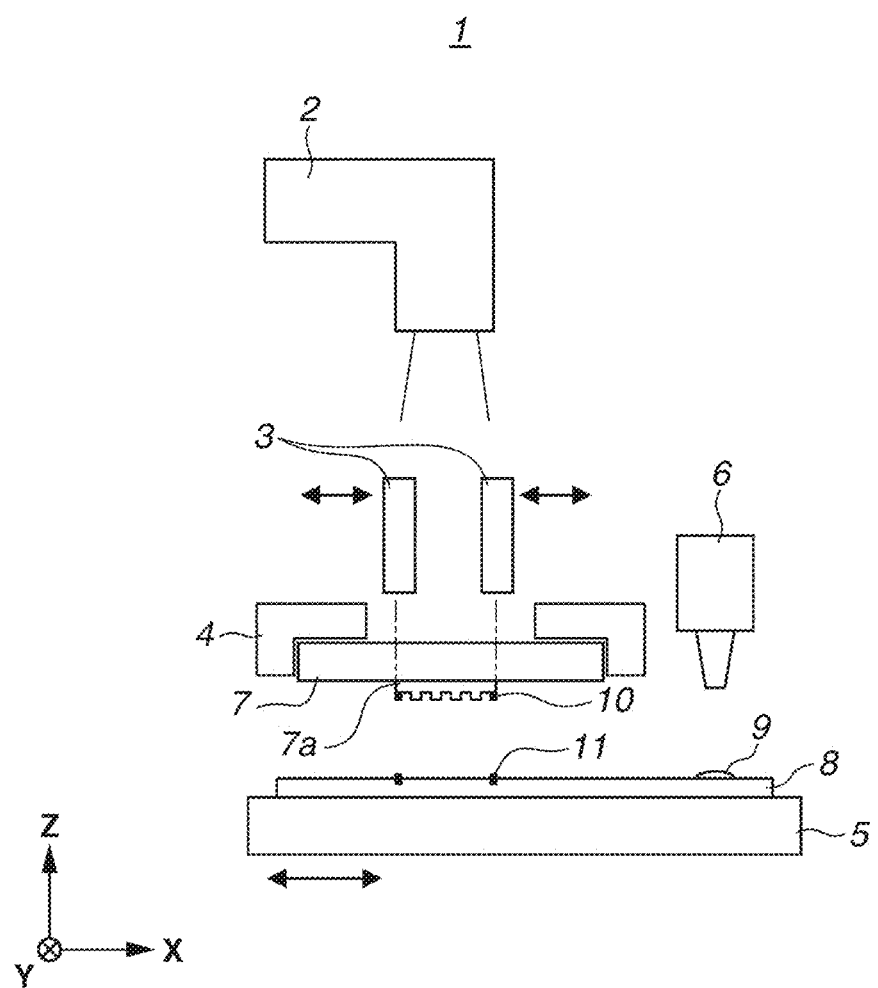
FIG. 1 is a view illustrating an imprint apparatus according to a first exemplary embodiment of the present invention.

FIG. 1 is a schematic view illustrating a configuration of an imprint apparatus according to the first exemplary embodiment. The imprint apparatus is an apparatus for molding an imprint material (resin) supplied to a substrate which is an object to be processed with a mold to transfer a pattern onto the substrate. For example, the imprint apparatus is used to manufacture a device such as a semiconductor device. In the following drawings, the X-axis and Y-axis orthogonal to each other are set on a plane parallel to the substrate and the mold, and the Z-axis is set in a direction orthogonal to the X-axis and the Y-axis.

The imprint apparatus 1 includes a irradiation unit 2, a detection unit 3, a mold holding unit 4, a substrate stage 5, and an applying mechanism 6.

The irradiation unit 2 is a irradiation apparatus for radiating light to cure a resin 9 while a mold 7 having an uneven pattern 7a and the resin 9 supplied to the substrate 8 are in contact with each other. The irradiation unit 2 includes a light source (not shown). The irradiation unit 2 may include a plurality of optical elements for uniformly radiating the light in a predetermined shape exiting from the light source to a region of the pattern 7a which is a radiated surface. The irradiation region (irradiation range) of the light can correspond to an area of the region of the pattern 7a or can be larger than the area to a small extent. This is because the mold 7 or the substrate 8 can be restrained from expanding due to heat accompanied by the irradiation and the pattern transferred to the resin 9 can be prevented from being positionally displaced or distorted by minimizing the irradiation region. Moreover, this is also because an operation of the applying mechanism is restrained from becoming abnormal later due to the light reflected on the substrate 8 reaching the applying mechanism 6 to cure the resin left in a discharge port of the applying mechanism 6.

The light source may be, for example, a high-pressure mercury lamp, an excimer lamps, an excimer laser, a light emitting diode, or the like. Here, since a photo curable resin which can be cured with a UV light is used as the resin 9, a UV light is radiated from the light source. However, a wavelength of the light radiated from the light source may be properly determined according to the used resin. Further, the present invention is not limited by the type, number, or wavelength of the light source.

The detection unit 3 (position detection apparatus) detects marks to align the mold 7 and the substrate 8 relatively corresponding to each other. Specifically, a relative position of the mold 7 and the substrate 8 may be measured by optically detecting an alignment mark 10 formed in the mold 7 and an alignment mark 11 formed in the substrate 8. An optical axis of the detection unit 3 is arranged to be vertical to the mold or the substrate. The detection unit 3 is arranged to be movable in the X-direction and the Y-direction according to the positions of the alignment marks 10 and 11. Further, the detection unit 3 is movable in the Z-direction to adjust a focus of the optical system to the positions of the alignment marks. After the alignment marks are detected, the substrate stage 5 or the below-described magnification calibrating mechanism are controlled based on information regarding the measured relative position between the mold 7 and the substrate 8.

The mold holding unit 4 includes a mold chucking mechanism for pulling the mold 7 by a vacuum suction force or an electrostatic force to hold the mold 7. Further, the mold holding unit 4 includes a mold driving mechanism (not shown) for thrusting the mold 7 to the resin 9 supplied to the substrate 8. The mold driving mechanism can move the mold 7 in the Z-direction. In addition, the mold holding unit 4 includes a mold magnification calibrating mechanism (not shown) for deforming the mold 7 in the X-direction and the Y-direction to calibrate the distortion of the pattern.

The substrate stage 5 includes a substrate chucking mechanism for pulling the substrate 8 with a vacuum suction force or an electrostatic force to hold the substrate 8. The substrate stage 5 is a substrate holding unit for allowing the substrate 8 to move on the XY plane while holding the substrate 8.

The imprinting and separating operations of the imprint apparatus 1 may be realized by moving the mold holding unit 4 (mold 7) in the Z-direction, or the substrate stage 5 (substrate 8) may be moved in the Z-direction. Further, both the mold 7 and the substrate 8 may be moved.

The applying mechanism 6 is a supply apparatus for supplying the resin 9 to the substrate 8. The applying mechanism 6 includes a nozzle for supplying the resin 9. The applying mechanism 6 may not be disposed within the imprint apparatus 1, or may be disposed outside the imprint apparatus 1. For example, the substrate 8 to which the resin is supplied in advance by an external applying mechanism may be introduced into the imprint apparatus 1. According to the configuration, since an applying process within the imprint apparatus 1 is eliminated, a processing time in the imprint apparatus 1 can be shortened. Further, since the applying mechanism 6 becomes unnecessary, manufacturing costs of the entire imprint apparatus 1 can be reduced.

The mold holding unit 4 holds the mold 7 such that a surface of the mold 7 having an uneven pattern 7a faces the substrate 8. The predetermined uneven pattern 7a is formed on the surface of the mold 7 facing the substrate 8. The mold 7 is a mold where a predetermined pattern (for example, a circuit pattern, or the like) is formed in a 3-dimensional shape. In order to radiate the light to the resin 9 through the mold 7, the mold 7 is made of a light transmitting material. The material may be, for example, quartz, or the like.

The substrate 8 is, for example, a processed object such as a semiconductor wafer made of a single crystal silicon, a glass substrate, or the like. The resin 9 (imprint material) is supplied to a surface (processed surface) of the substrate 8.

In the present exemplary embodiment, a photo curable resin having a property of being cured while receiving a UV light is used as the resin 9. A material of the resin 9 is properly selected according to the type of semiconductor device to be manufactured.

Next, an imprint processing of the imprint apparatus 1 will be described. First, the substrate 8 is conveyed into the substrate stage 5 by a substrate conveying unit (not shown), and the substrate 8 is mounted onto the substrate stage 5. The substrate 8 held by the substrate stage 5 is moved to an applying position to apply the resin 9 on a surface of the substrate 8 using the applying mechanism 6. Thereafter, in an applying process, the applying mechanism 6 supplies the resin 9 to a predetermined shot (imprint region) of the substrate 8. Next, the substrate stage 5 is moved such that the shot to which the resin 9 is supplied is positioned directly below the mold 7. Next, the pattern 7a formed in the mold 7 is imprinted into the resin 9 supplied to the substrate 8 (an imprinting process) by driving the mold driving mechanism.

Then, the resin 9 flows along the pattern 7a by the imprinting process of the mold 7. More specifically, the resin 9 is filled in a recessed portion of the pattern 7a. In this state, the alignment marks 10 and 11 formed in the substrate 8 and the mold 7 are detected by the detection unit 3. As the substrate stage 5 is moved, a pattern surface of the mold 7 and an applying surface of the substrate 8 are aligned, and a magnification of the mold 7 is calibrated by the magnification calibrating mechanism. In the step where the filling of resin 9 in the pattern 7a, alignment of the mold 7 and the substrate 8, and the calibration of the magnification of the mold 7 has been sufficiently performed, the irradiation unit 2 radiates light through the mold 7 and the resin 9 is cured by the light having passed through the mold 7 (a curing process). In this case, the detection unit 3 is retracted so as not to block a light passage of the light radiated from the irradiation unit 2. After the resin 9 is cured, the mold 7 and the substrate 8 are separated from each other (a separating process), so that the pattern 7a of the mold 7 is transferred onto the substrate 8.

Subsequently, a method of detecting an alignment mark 10 formed in the mold 7 and an alignment mark 11 formed in the substrate 8 will be described in detail.

Figure 2:
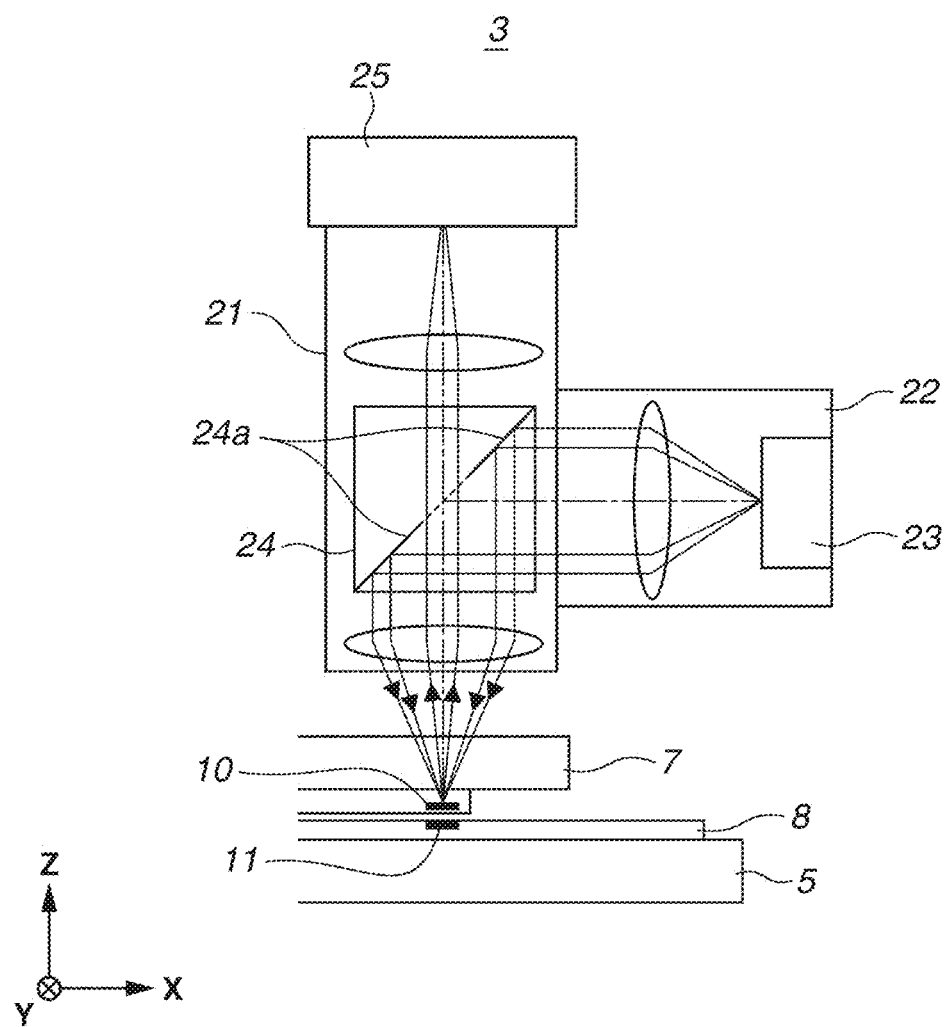
FIG. 2 is a view illustrating a position detection apparatus according to the first exemplary embodiment of the present invention.

FIG. 2 is a schematic view illustrating an example of a configuration of the detection unit 3 according to the present exemplary embodiment. The detection unit 3 has a configuration including a detection optical system 21 and an illumination optical system 22. FIG. 2 illustrates that an optical axis of the detection optical system and an optical axis of the illumination optical system are partially common.

The illumination optical system 22 guides the light from the light source 23 onto the same optical axis as that of the detection optical system 21 using an optical member such as a prism 24 or the like to illuminate the alignment marks 10 and 11.

For example, a halogen lamp, an LED, or the like may be used as the light source 23. The light radiated from the light source 23 may have a wavelength different from a wavelength of the light radiated from the above-described irradiation unit 2. For example, a UV light is used as the light radiated from the irradiation unit 2, and a visible ray or an infrared ray is used as the light radiated from the light source 23.

The detection optical system 21 and the illumination optical system 22 share some of the optical members constituting them, and the prism 24 is arranged on or in the vicinity of the pupil plane of the detection optical system 21 and the illumination optical system 22. Each of the alignment marks 10 and 11 is configured with diffraction gratings. The detection optical system 21 forms an image of the pattern (moiré stripe pattern) generated by the diffracted light from the alignment mark 10 illuminated by the illumination optical system 22 and the diffracted light from the alignment mark 11 on an image sensor 25. The image sensor 25 may employ a CCD, a CMOS, or the like.

The prism 24 has a reflective film 24a for reflecting light at a periphery of a pupil plane of the illumination optical system 22 on a bonding surface thereof. The reflective film 24a serves as an aperture stop for defining a distribution form of pupil intensities of the illumination optical system 22. Further, the reflective film 24a serves as an aperture stop for defining a size of the pupil of the detection optical system 21. In addition, the reflective film 24a defines a detection NA (NAo).

The prism 24 may be not limited to a half prism or may be half prism having a semi-transparent film on a bonding surface thereof, or may be a plate-shaped optical element having a reflective film formed on a surface thereof. Further, in order to change the shape of the pupil of the illumination optical system 22 or the detection optical system 21, the prism 24 may be replaceable with a prism having a shape of another aperture by a changing mechanism such as a turret (not shown), a slide mechanism, or the like. The location of the prism 24 may not be arranged on or in the vicinity of the pupil planes of the detection optical system 21 and the illumination optical system 22.

Figure 3:
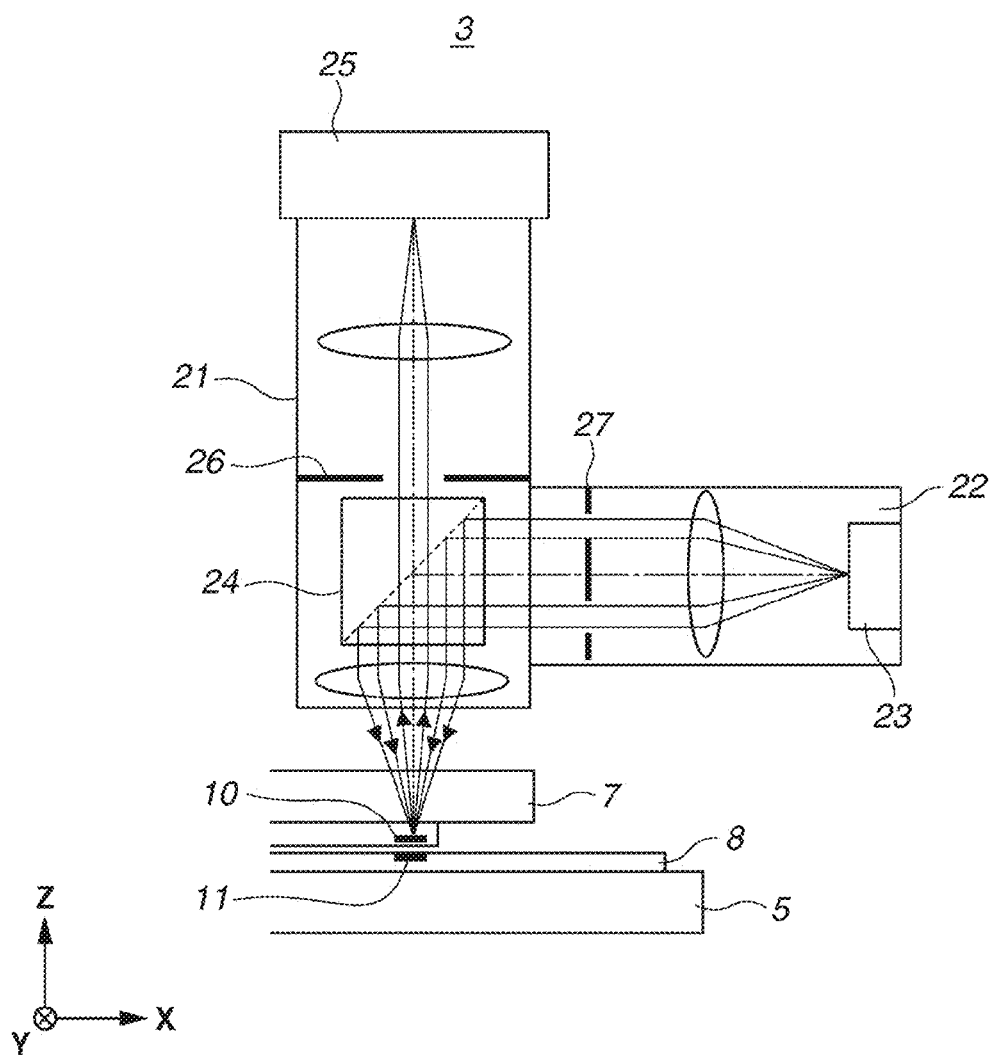
FIG. 3 is a view illustrating a position detection apparatus according to the first exemplary embodiment of the present invention.

Further, the aperture stop defining the distribution form of the pupil intensities may not be arranged in the prism 24. For example, as illustrated in FIG. 3, an aperture stop 26 is arranged on a pupil plane of the detection optical system 21 and an aperture stop 27 is arranged on a pupil plane of the illumination optical system 22. The aperture stop 26 defines the size of the pupil of the detection optical system 21, and the aperture stop 27 defines a distribution of the pupil intensities of the illumination optical system 22. In this case, a half prism having a semi-transparent film on a bonding surface thereof is used as the prism 24. The aperture stop 26 and the aperture stop 27 may be changed to an aperture stop having a shape of another aperture by a changing mechanism such as a turret (not shown), or the like.

Figure 4:
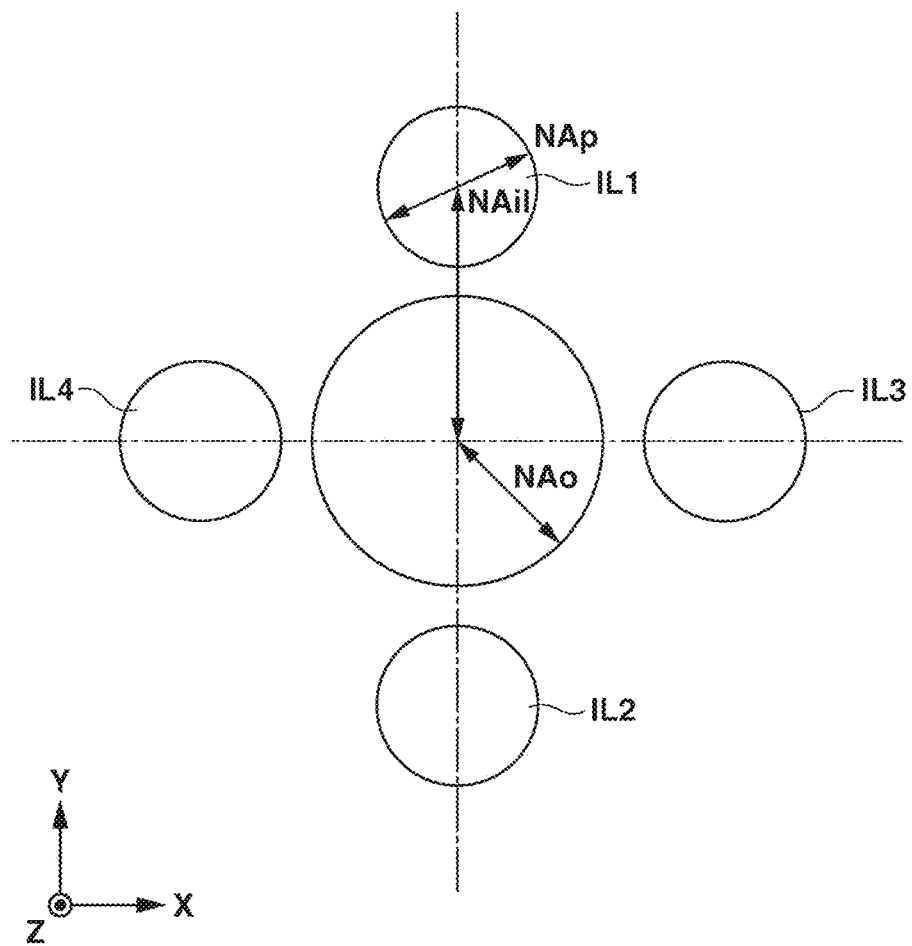
FIG. 4 is a view illustrating distribution of illumination pupils of the position detection apparatus according to the first exemplary embodiment of the present invention.

FIG. 4 illustrates a relationship between a distribution of illumination pupils of the detection unit 3 and a detection NA (NAo). FIG. 4 illustrates the sizes of pupils with numerical apertures (NA) on the pupil plane of the illumination optical system. The distribution of the illumination pupils of the illumination optical system 22 according to the present exemplary embodiment includes four light intensity distributions (poles) of IL1 to IL4. As described above, since the aperture stop 27 is arranged on the pupil plane of the illumination optical system 22, a plurality of poles may be formed from one light source 23. A plurality of light sources are not required owing to a light intensity distribution having a plurality of peaks, so that the detection unit 3 can become simple or small-sized.

Each of the poles IL1 to IL4 has circular form having diameter NAp. Here, the intersection point of the X-axis and the Y-axis is taken as the optical axis of the optical systems, and the optical axis of the detection optical system and the optical axis of the illumination optical system are common.

The poles IL1 and IL2 are arranged at locations spaced apart from the optical axis on the Y-axis of the pupil plane by NAil (NAil1) in positive and negative directions, respectively. In this way, the poles IL1 and IL2 may be disposed to be symmetrical to each other with respect to the optical axis on axes parallel to the Y-axis direction except for on the optical axis. The size of the pole is Nap (NAp1).

The poles IL3 and IL4 are arranged at locations spaced apart from the optical axis on the X-axis of the pupil plane by NAil (NAil2) in positive and negative directions, respectively. In this way, the poles IL3 and IL4 may be arranged to be symmetrical to each other with respect to the optical axis on axes parallel to the X-axis direction except for on the optical axis. The size of the pole is Nap (NAp2).

In other words, the illumination optical system 22 forms a distribution of illumination pupils to illuminate the alignment marks 10 and 11 at an oblique incidence at the same time. The incidence angle θ to the alignment marks 10 and 11 is as follows.

$$\theta = \sin^{-1}(NAil) \qquad \text{Equation 1}$$

Further, NAo, NAp, and NAil satisfy the following Equation 2.

$$NAo < NAil - NAp/2 \qquad \text{Equation 2}$$

In other words, a dark field is configured such that a regular reflection light (zero-order diffracted light) from the alignment marks 10 and 11 is not detected.

Next, the principle of generating a pattern (moiré stripe pattern) generated by the diffracted light from the alignment marks 10 and 11 and detection of a relative position thereof using the moiré stripe pattern will be described with reference to FIGS. 5A to 5D.

The periods in the measurement direction of the diffraction gratings formed in the mold and the substrate are slightly different from each other. If the diffraction gratings having different periods overlap each other, a pattern (so called, moiré stripe pattern) having a period reflecting a period difference between the diffraction gratings appears due to an interference between the diffracted light from two diffraction gratings. In this case, since the phase of the moiré stripe pattern is changed according to a relative position of the diffraction gratings, a relative alignment of the substrate and the mold can be realized by observing the moiré stripe pattern.

Figure 5A:
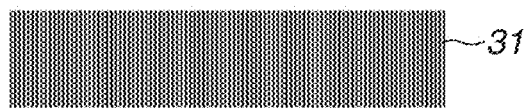
FIGS. 5A to 5D are views illustrating alignment marks generating moiré stripe patterns.
Figure 5B:
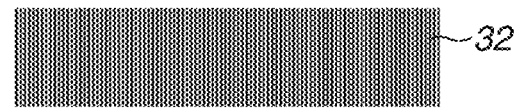
Figure 5C:
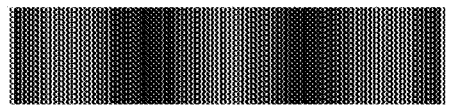
Figure 5D:
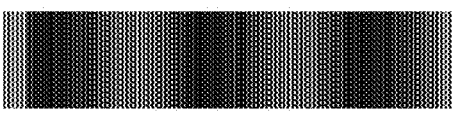

When the diffraction grating 31 and the diffraction grating 32 having periods slightly different from each other as illustrated in FIGS. 5A and 5B overlap each other, the diffracted light from the diffraction gratings overlap each other, so that a pattern (moiré stripe pattern) in FIG. 5C having a period reflecting the period difference is generated. In the moiré stripe pattern, the locations of brightness and darkness (phase of the stripe pattern) are changed according to a relative position of the two diffraction gratings 31 and 32. For example, if one diffraction grating is shifted in the X-direction by some degree, the moiré stripe pattern of FIG. 5C is changed as in FIG. 5D. Since the phase of the moiré stripe pattern is changed by a period larger than the size of the actually changed relative position of the two diffraction gratings, a relative position of two objects can be measured with a high precision even when a resolution of the detection optical system 21 is low.

Figure 6A:
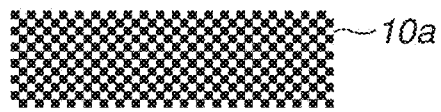
FIGS. 6A and 6B are views illustrating alignment marks in an X-direction according to the first exemplary embodiment of the present invention.

Here, if the diffraction gratings of FIGS. 5A and 5B are to be detected from a bright field (are to be illuminated from a vertical direction and a diffraction light is to be detected from a vertical direction) to detect the moiré stripe pattern, zero-order diffracted light from the diffraction gratings are also detected. Since the zero-order diffracted light lowers the contrast of the moiré stripe pattern, the detection unit 3 according to the present exemplary embodiment has a configuration of a dark field which does not detect a zero-order diffracted light as described above. Thus, any one of the diffraction grating formed in the mold and the diffraction grating formed in the substrate is a checkerboard shaped diffraction grating as illustrated in FIG. 6A so that the moiré stripe pattern can be detected even in the configuration of the dark field illuminating at an oblique incidence. Although the result is the same even though the checkerboard shaped diffraction grating is applied to any one of the mold side diffraction grating and the substrate side diffraction grating, a case of taking the mold side diffraction grating as the checkerboard shaped grating will be described as an example.

In the method of detecting a relative position using the moiré stripe pattern, an alignment can be advantageously carried out with a high precision even if a detection optical system with a low resolution is used.

Figure 6B:
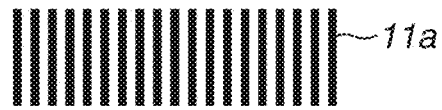

FIGS. 6A and 6B illustrate the diffraction grating 10$a$ of the mold side alignment mark 10 (first mark), and the diffraction grating 11$a$ of the substrate side alignment mark 11 (second mark), for detecting a relative position of the mold and the substrate in the X-direction, respectively. The mold side alignment mark 10 is the checkerboard shaped diffraction grating 10$a$ having a periodic structure with periods Pm (P1) in each of the X-direction (second direction) and the Y-direction (first direction). Further, the substrate side alignment mark 11 is the diffraction grating 11$a$ having a periodic structure with a period Pw different from the period Pm in the X-direction.

The principle of detecting a moiré stripe pattern using the detection unit 3 while the two diffraction grating 10$a$ (first diffraction grating) and 11$a$ (second diffraction grating) overlap each other will be described with reference to FIGS. 7A and 7B. Here, although the periods of the diffraction grating 10$a$ in the X-direction and the Y-direction are assumed to be the same, they may not be necessarily the same, and the periods of the diffraction grating 10$a$ in the X-direction and the Y-direction may be different. Here, although a case where the periods of the diffraction grating 10$a$ in the X-direction and the Y-direction are the same will be described for ease of description, the basic description is the same even though the periods in the X-direction and the Y-direction are different.

Figure 7A:
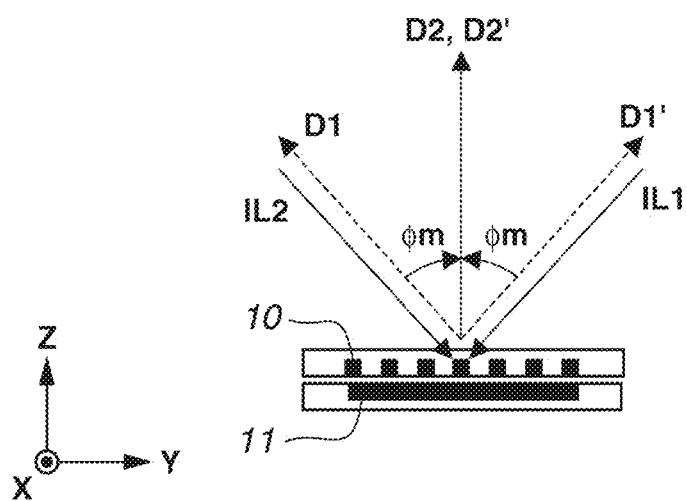
FIGS. 7A and 7B are views illustrating diffracted light of the alignment marks according to the first exemplary embodiment of the present invention.
Figure 7B:
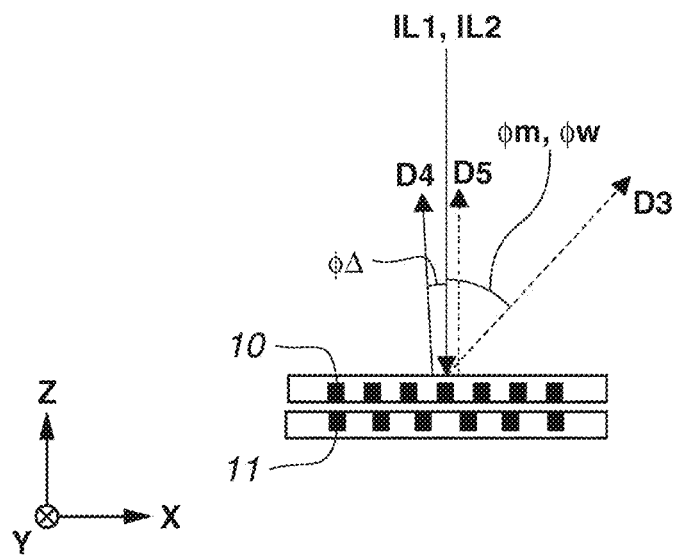

FIGS. 7A and 7B are views of the diffraction grating 10$a$ and the diffraction grating 11$a$ when viewed from a direction along the X-axis and a direction along the Y-axis, respectively. The moiré stripe pattern for detecting a relative position in the X-direction is generated by the poles IL1 and IL2 lining up in the direction along the Y-axis in the illumination pupil plane illustrated in FIG. 4.

Here, the diffraction angle $\phi$ according to the diffraction grating is expressed in the following equation, where d is the period of the diffraction grating, $\lambda$ is the wavelength of light, and n is the order of diffraction.

$$\sin \phi = n\lambda/d \qquad \text{Equation 3}$$

Thus, when the diffraction angles according to the diffraction gratings 10$a$ and 11$a$ are assumed to be $\phi m$ and $\phi w$, respectively, following equations can be derived.

$$\sin \phi m = n\lambda/Pm \qquad \text{Equation 4}$$

$$\sin \phi w = n\lambda/Pw \qquad \text{Equation 5.}$$

The diffracted light in the Y-direction (non-measurement direction) will be described with reference to FIG. 7A. First, the diffraction grating 10$a$ and the diffraction grating 11$a$ are illuminated from the Y-axis direction at an oblique incidence at the same time by the poles IL1 and IL2 lining up in a direction along the Y-axis which is a non-measurement direction in the illumination pupil plane. The light (zero-order diffracted light) D1 and D1' regularly reflected by the diffraction gratings 10$a$ and 11$a$ do not enter the detection optical system 21 since the detection unit 3 satisfies Equation 2. Meanwhile, the light D2 and D2' diffracted by the angle $\phi m$ by the mold side diffraction grating 10$a$ having a period of Pm in the Y-direction are detected by the detection optical system 21. In the present exemplary embodiment, in order that a ±1-order diffracted light having the highest diffraction intensity among the diffracted light except for the zero-order diffracted light can be detected, Pm, NAo, NAil, and NAp satisfy the following condition.

$$|NAil - |\sin \phi m|| = |NAil - \lambda/Pm| < NAo + NAp/2 \qquad \text{Equation 6}$$

In other words, the diffracted light in the Y-direction can be detected with the wavelength $\lambda$ in a range satisfying Equation 6.

Here, since the first order diffracted light can be detected most efficiently when D2 is orthogonal to the Y-axis, when the central wavelength of the illumination light output from the light source is assumed to be $\lambda c$, the illumination condition and the period of the mold side diffraction grating is desired to be adjusted as follows.

$$NAil - \lambda c/Pm = 0 \qquad \text{Equation 7.}$$

As described above, in the Y-direction, the mold side diffraction grating 10$a$ is illuminated at an oblique incidence, the light is diffracted in the Y-direction by the diffraction grating 10$a$ and the diffracted light is detected by the detection optical system 21.

Next, the diffracted light in the X-direction (measurement direction) will be described with reference to FIG. 7B.

The poles IL1 and IL2 lining up along the Y-axis on the illumination pupil plane enter the diffraction gratings 10$a$ and 11$a$ from a direction orthogonal to the X-axis. Similarly to the case of the Y-direction, considering the +/−1 order diffracted light, the diffracted light D4 diffracted to the mold side diffraction grating 10a in the +/−1 order and diffracted to the substrate side diffraction grating 11a in the +/−1 order enters the detection optical system 21 at a small angle with respect to the X-axis as Pm and PW are close to each other. In this case, the diffraction angle φΔ is expressed in the following Equation.

$$\sin \phi\Delta = \lambda \times |Pw - Pm|/PmPw \qquad \text{Equation 8}$$

When |Pw−Pm|/PmPw=PΔ in Equation 8, following equation can be de derived.

$$\sin \phi\Delta = \lambda/P\Delta \qquad \text{Equation 9}$$

This means that a pattern having a period of PΔ is generated by the diffracted light D4. The pattern is a moiré stripe pattern, and the period depends on a difference between the periods of the mold side diffraction grating and the substrate side diffraction grating. However, since the mold side diffraction grating has a checkerboard shape in the present exemplary embodiment, the period of the generated moiré stripe pattern becomes PΔ/2. In this case, since the change of the relative position of the mold and the substrate is magnified to the positional displacement of brightness and darkness of the moiré stripe pattern, an alignment can be carried out with a high precision even when a detection optical system with a low resolution is used.

Next, the light diffracted once in any one of the mold side diffraction grating 10a or the substrate side diffraction grating 11a exits at an angle φm or φw (D3 of FIG. 7B). Since D3 becomes noise without generating a moiré stripe pattern, it is desirable that D3 does not detected by the detection optical system 21. Accordingly, in the present exemplary embodiment, the period of the diffraction grating and the detection unit 3 are adjusted to satisfy the following Equations 10 and 11.

$$NAo+NAp/2<|\sin \phi m|=\lambda/Pm \qquad \text{Equation 10}$$

$$NAo+NAp/2<|\sin \phi w|=\lambda/Pw \qquad \text{Equation 11}$$

The light (zero-order diffracted light, D5 of FIG. 7B) which is not diffracted in the X-axis direction in any one of the mold side diffraction grating 10a and the substrate side diffraction grating 11a is diffracted on the mold and is regularly reflected on the substrate to enter the detection optical system 21. The diffracted light (of a total of zero order) which is not diffracted in the substrate side diffraction grating but is diffracted in the mold side diffraction grating in the X-axis direction in +/−n-order and −/+n-order before and after reflected on the substrate, respectively, also enters the detection optical system 21. Although the light lowers the contrast of the moiré stripe pattern without generating a moiré stripe pattern, since the mold side diffraction grating 10a has a checkerboard shape in the present exemplary embodiment, the phases of the diffracted light from the adjacent gratings are different from each other by π, causing the diffracted light to be offset. Thus, the intensity of D5 is restrained, enabling to measure the moiré stripe pattern with a high contrast.

Although the detection of the moiré stripe pattern for measuring a relative position of the mold and the substrate in the X-direction has been described, the detection of the moiré stripe pattern for measuring a relative position thereof in the Y-direction is basically the same except that the directions of the alignment mark and the oblique incidence illumination are changed between the X-direction and the Y-direction.

FIGS. 8A and 8B illustrate the diffraction grating 10b of the mold side alignment mark 10 for detecting a relative position of the mold and the substrate in the Y-direction and the diffraction grating 11b of the substrate side alignment mark 11, respectively. The mold side alignment mark 10 (third mark) is a checkerboard shape diffraction grating 10b (third diffraction grating) having a periodic structure with periods Pm (P2) in each of the X-direction and the Y-direction. Further, the substrate side alignment mark 11 (fourth mark) is the diffraction grating 11b (fourth diffraction grating) having a periodic structure with a period Pw different from the period Pm in the Y-direction.

The moiré stripe pattern for detecting a relative position of the mold and the substrate in the Y-direction is generated by illuminating the diffraction grating 10b and the diffraction grating 11b with the light radiated from the illumination optical system at the same time. In other words, the moiré stripe pattern is generated by the poles IL3 and IL4 lining up in a direction along the X-axis in the illumination pupil plane illustrated in FIG. 4.

Here, in the present exemplary embodiment, the moiré stripe pattern for measuring a relative position of the mold and the substrate in the X-direction is generated by the poles IL1 and IL2 lining up on an axis parallel to the Y-axis direction in the illumination pupil plane illustrated in FIG. 4. In other words, the moiré stripe pattern is generated by the light intensity distributions lining up in a direction along the measurement direction in the illumination pupil plane.

Meanwhile, If the periods of the alignment mark 10 and the alignment mark 11 are adjusted, a moiré stripe pattern for measuring a relative position of the mold and the substrate in the X-direction also can be generated by the poles IL3 and IL4 lining up in a direction along the X-axis in the illumination pupil plane illustrated in FIG. 4. In other words, the moiré stripe pattern also can be generated by the light intensity distributions lining up along a direction orthogonal to the measurement direction in the illumination pupil plane.

However, in this case, since the incidence angles of the +1-order diffracted light and −1-order diffracted light obtained by diffracting IL3 and IL4 in the non-measurement direction to the diffraction grating 11a become greatly different from each other, only one of the +1-order diffracted light and the −1-order diffracted light can be detected. If they are to be detected immoderately, the NA of the detection optical system needs to become very large.

To the contrary, when the moiré stripe pattern is generated by the poles lining up in a direction along the measurement direction in the illumination pupil plane, both the +1-order diffracted light and −1-order diffracted light of the illumination light diffracted in the measurement by the diffraction grating 10a may be detected while maintaining a relatively small detection NA. In other words, since the two times diffracted light can be detected, the moiré stripe pattern can be advantageously detected by a two times amount of light.

U.S. Pat. No. 7,292,326 discuses the position detection method in which light diffracted by a diffraction grating formed on a substrate is detected from a direction which is not vertical to a mold or a wafer. Accordingly, information of relative positions regarding a plurality of directions cannot be acquired with one detection unit. Since there is a need to acquire information of relative positions regarding at least two directions (for example, the X-direction and the Y-direction) to carry out an alignment of the substrate and the mold, at least two detection units are required. Further, if information regarding relative positions, for example, at four locations of a shot is to be acquired to calibrate the shot shapes or magnifications of the mold and the substrate, eight detection units are required. Accordingly, since many detection units are required, apparatus costs are increased, the arrangement of the optical systems becomes complex, and it becomes difficult to secure spaces for arranging the optical systems.

Figure 9:
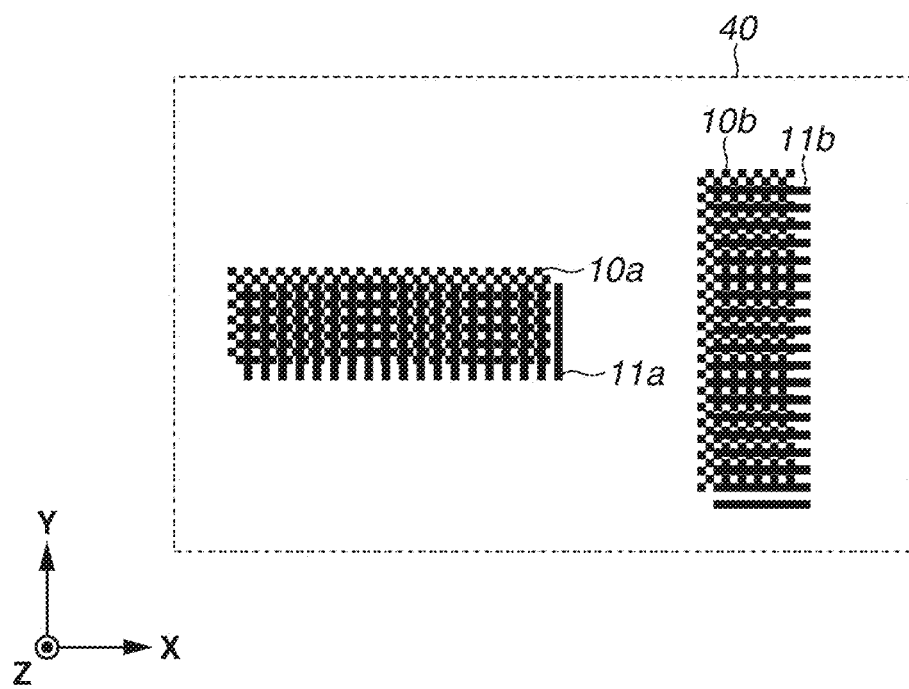
FIG. 9 is a view illustrating that the position detection apparatus according to the first exemplary embodiment of the present invention detects alignment marks in the X-direction and the Y-direction.

Thus, the marks obtained by overlapping the diffraction gratings 10a and 10b with the diffraction gratings 11a and 11b, respectively as in FIG. 9 are detected by using the detection unit 3 having the illumination pupil distribution and the detection NA (NAo) as in FIG. 4. As illustrated in FIG. 9, as the alignment mark in the X-direction and the alignment mark in the Y-direction are arranged in the field 40 of the detection unit 3 at the same time, the moiré stripe patterns for the alignments in the X-direction and the Y-direction can be observed at the same time. In other words, in the position detection system according to the present exemplary embodiment, information regarding relative positions in two directions can be acquired by one detection unit 3 (the detection optical system 21 and the illumination optical system 22) at the same time.

Conventionally, one detection unit is required for a mark in one direction, however, according to present exemplary embodiment the number of detection units can be reduced as compared with the conventional technique. Accordingly, a relative position detection system which is inexpensive and simplified can be provided.

Although the case where the periods of the diffraction grating 10a and the diffraction grating 10b are the same and the periods of the diffraction grating 11a and the diffraction grating 11b are the same has been described, the present invention is not limited thereto. Specifically, the periods of the diffraction grating 10a and the diffraction grating 10b may be different from each other, and the periods of the diffraction grating 11a and the diffraction grating 11b may be different from each other. Further, the distances from the optical axis of the detection unit 3 to the poles IL1 and IL2 and the distances from the optical axis to the poles IL3 and IL4 may be different from each other.

Meanwhile, if the diffraction grating 10a and the diffraction grating 10b are diffraction gratings having periodic structures with the same periods in the X-direction and the Y-direction, respectively, the alignment mark 10 formed in the mold may be of one type. Specifically, the diffraction grating 10a for an alignment in the X-direction and the diffraction grating 10b for an alignment in the Y-direction may correspond to a common alignment mark, and then, the design of the alignment mark may be simplified.

Further, in this way, since the diffraction grating 10a and the diffraction grating 10b may be diffraction gratings having periodic structures with the same period, the diffraction grating 10a and the diffraction grating 10b may be a single common diffraction grating. Specifically, the diffraction grating 10a and the diffraction grating 10b may become one diffraction grating having a sufficient area overlapping the diffraction grating 11a and the diffraction grating 11b at the same time. Accordingly, the design of the alignment mark may be simplified.

While a diffracted light can be detected with a wavelength λ in a range satisfying Equation 6 in the position detection system according to the present exemplary embodiment as described above, it is desirable that the wavelength range is as wide as possible.

The alignment mark 11 formed in the substrate 8 is rarely exposed at a surface of the substrate 8, but is mostly formed in an interior of a process where several to several tens of layers are stacked. When a layer consisting of a transparent material is formed on the alignment mark 11, an intensity of the light reflected from the mark becomes occasionally weak according to a wavelength of an illumination light due to thin film interference. In this case, if the wavelength λ of the illumination light is changed, the illumination light deviates from the thin film interference condition, enabling visibility of the mark 11.

Accordingly, it is useful that a wavelength λ of the illumination light is varied over a wide range even when the alignment mark is detected by the detection unit 3, and the best detection condition can be set according to the process preparing the substrate 8. The best detection condition refers to a condition where, for example, signal intensity or a contrast of the moiré stripe pattern is maximal. The wavelength λ of the illumination light may be provided by cutting a desired wavelength bandwidth with a bandpass filter or the like from a light source having a wide bandwidth wavelength such as a halogen lamp as the light source 23, or by providing a plurality of light sources having different central wavelengths as monochromatic light sources such as LEDs to change therebetween.

If the wavelength λ of the illumination lamp is selected, since the diffraction condition of Equation 3 is changed, the signal intensity or contrast of the moiré stripe is changed and the measurement precision is occasionally lowered. Further, a wavelength which does not satisfy Equation 6 is occasionally selected. In this case, the NA of the detection optical system, the light intensity distribution of the illumination optical system on the pupil plane, and the periods of the diffraction gratings of the alignment marks 10 and 11 are also changed, enabling enhancement of the intensity, contrast, or the like of the moiré stripe pattern.

That is, it is useful that the wavelength λ of the illumination light, the NA of the detection optical system, the pupil distribution form of the illumination optical system, and the periods of the diffraction gratings of the alignment marks 10 and 11 are properly selected to realize the best detection condition for the moiré stripe pattern according to the process for preparing the substrate 8. As described above, the changes in the NA of the detection optical system and the pupil intensity distribution of the illumination optical system are realized by changing the prism 24 and the aperture stops 26 and 27 arranged in the detection unit 3. In the present exemplary embodiment, as in FIG. 4, quadrupole illumination formed of respective two poles in the X-direction and the Y-direction as the light intensity distribution of the pupil plain of the illumination optical system has been described. A dipole illumination formed of two poles in the X-direction or the Y-direction may be used as the shape of the light intensity distribution. Here, a region in the pupil plane having light intensity greater than circumference is referred to as the pole. Accordingly, light may exists between the poles. Further, the shape of the light intensity distribution may be annular shape (annular illumination). In this case, respective two light intensity peaks (poles) are formed in the X-direction and the Y-direction. As a result, even if the annular illumination is used, the illumination optical system can irradiate, in the non-measurement direction, a light having a plurality of poles.

In this way, since the detection unit 3 according to the present exemplary embodiment detects one moiré stripe pattern vertically by illuminating the alignment mark from two directions at an oblique angle at the same time, two times of an amount of light can be secured compared with a conventional measurement optical system for detection from an inclined direction where illumination is carried out from one direction at an oblique angle. Accordingly, a relative position of two objects can be detected with a high precision.

In the present exemplary embodiment, a case where a first object having a first mark and a third mark is the mold and a second object having a second mark and a fourth mark is the substrate has been described. However, the first mark and the third mark may be formed in the substrate, and the second mark and the fourth mark may be formed in the mold. However, among the two objects, the one of the two objects disposed on the light source side needs to be a light transmitting property to detect a relative position of the two objects arranged to overlap each other. In the first exemplary embodiment, the mold which is an object having a light transmitting property is arranged on the light source side along the optical axis of the position detection apparatus.

A position detection apparatus according to a second exemplary embodiment will be described.

The position detection apparatus according to the present exemplary embodiment has the same basic configuration as that of the position detection apparatus according to the first exemplary embodiment, except that the illumination pupil distribution of the detection unit 3 and the configurations of the alignment marks 10 and 11 are different. Further, the imprint apparatus including the position detection apparatus (detection unit 3) according to the present exemplary embodiment have the same basic configurations and the imprint processing method thereof is the same as those of the first exemplary embodiment.

Figure 10:
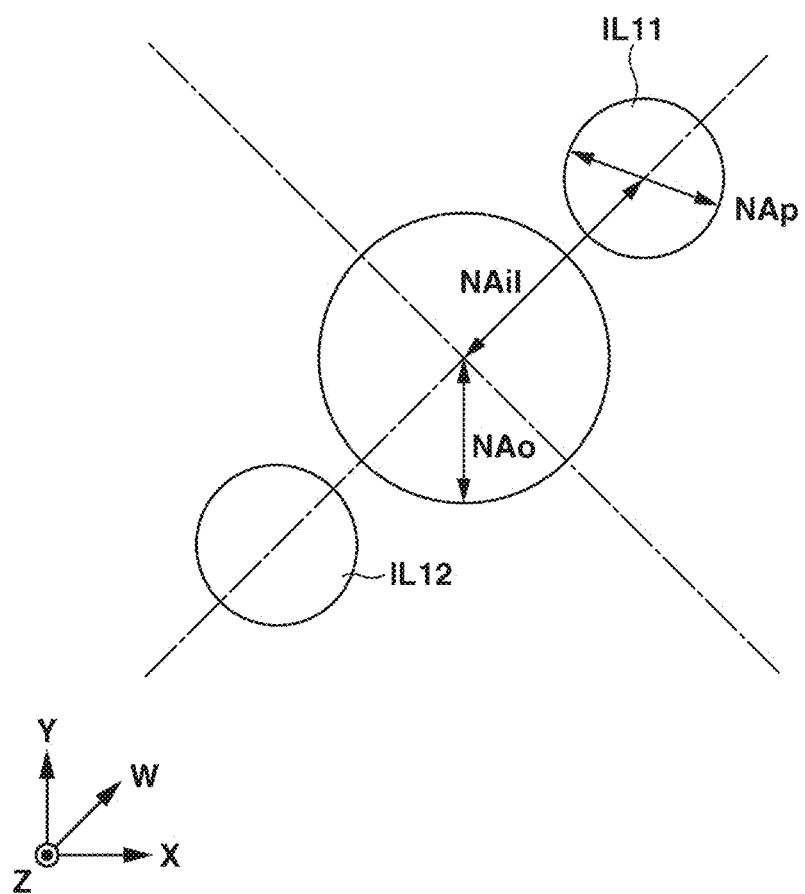
FIG. 10 is a view illustrating distribution of illumination pupils of a position detection apparatus according to a second exemplary embodiment of the present invention.

FIG. 10 illustrates a relationship between distributions of illumination pupils of the detection unit 3 (position detection apparatus) according to the present exemplary embodiment and a detection NA (NAo). Similarly to FIG. 4, FIG. 10 illustrates the size of pupils as the numerical apertures NA on the pupil plane of the illumination system. The illumination pupil distribution of the detection unit 3 according to the present exemplary embodiment includes two poles of IL11 and IL12. Each of IL11 and IL12 is circular poles with a diameter NAp. Here, a W-axis different from the X-axis and the Y-axis is newly defined on the XY plane. The W-axis is defined, for example, as a direction forming 45 degrees with each of the X-axis and the Y-axis. IL11 and IL12 are arranged at locations spaced apart from the optical axis on the W-axis in the pupil plane by NAil in the positive direction and the negative direction, respectively.

Thus, according to the present exemplary embodiment, the alignment marks 10 and 11 are illuminated at an oblique incidence. NAo, NAp, and NAil satisfy the above-described Equation 2, and are in a dark field configuration in which a regular reflection light (zero-order diffracted light) from the alignment marks 10 and 11 is not detected.

Figure 11A:
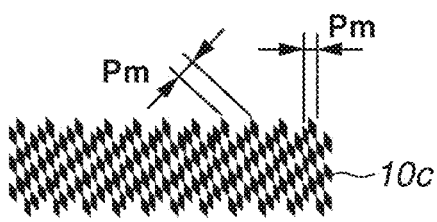
FIGS. 11A and 11B are views illustrating alignment marks in an X-direction according to the second exemplary embodiment of the present invention.
Figure 11B:
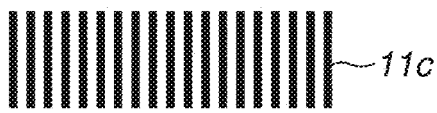

FIGS. 11A and 11B illustrate an alignment mark 10 formed in the mold and an alignment mark 11 formed in the substrate, for detecting a relative position of the mold 7 and the substrate 8 in the X-direction, respectively. The mold side alignment mark 10 (fifth mark) is a checkerboard shape diffraction grating 10c (fifth diffraction grating) having a periodic structure with a period Pm in each of the X-direction and the W-direction (third direction). Further, the substrate side alignment mark 11 (second mark) is a diffraction grating 11c (second diffraction grating) having a periodic structure with a period Pw different from Pm in the X-direction. Here, the periods of the diffraction grating 10c in the X-direction and the W-direction are the same, but they may not be the same. Specifically, the periods of the diffraction grating 10c in the X-direction and the W-direction may be different.

Figure 12A:
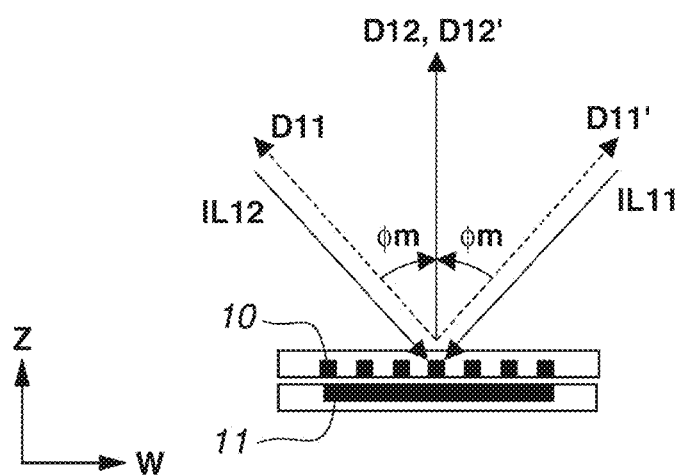
FIGS. 12A and 12B are views illustrating diffracted light of the alignment marks according to the second exemplary embodiment of the present invention.

The principle of detecting a moiré stripe pattern by the detection unit 3 while the two diffraction grating 10c and 11c overlap each other will be described with reference to FIG. 12. The principle is basically the same as the principle described in the first exemplary embodiment. FIGS. 12A and 12B illustrate the diffraction grating 10c and the diffraction grating 11c viewed from the WZ plane and the XZ plane, respectively. The moiré stripe pattern for detecting a relative position in the X-direction is generated by illuminating the diffraction grating 10c and the diffraction grating 11c with light radiated from the illumination optical system. The moiré stripe pattern is generated by the poles IL11 and IL12 lining up in a direction along the W-axis in the illumination pupil plane illustrated in FIG. 10.

The diffraction light in the W-direction (non-measurement direction) will be described with reference to FIG. 12A. First, the diffraction grating 10c and the diffraction grating 11c are illuminated at an oblique incidence from the W-direction by the poles IL11 and IL12 lining up in a direction along the W-axis which is a non-measurement direction in the illumination pupil plane. Similarly to the first exemplary embodiment, the diffraction angles $\phi m$ and $\phi w$ according to the diffraction grating 10c and 11c are expressed in Equations 4 and 5.

The light (zero-order diffracted light) D11 and D11' regularly reflected on the diffraction gratings 10c and 11c do not enter the detection optical system 21 since the detection unit 3 satisfies Equation 2. Meanwhile, the diffracted light D12 and D12' diffracted by the angle $\phi m$, by the diffraction grating 10c having a period of pm in the W-axis direction are detected by the detection optical system 21. Here, similarly to the first exemplary embodiment, since Pm, NAo, NAil, and NAp satisfy Equation 6, the diffraction light in the Y-axis direction can be detected at the wavelength $\lambda$ within a range satisfying Equation 6.

Further, since a 1-order diffraction light can be detected most efficiently when D12 is orthogonal to the Y-axis, it is useful as in the first exemplary embodiment that the illumination condition and the period of the mold side diffraction grating are adjusted.

As described above, in the W-direction, the mold side diffraction grating 10c is illuminated at an oblique angle and the diffracted light is diffracted in the W-direction by the diffraction grating 10c and detected by the detection optical system 21.

Next, the diffracted light in the X-direction (measurement direction) will be described with reference to FIG. 12B. Here, IL11 and IL12 are originally introduced from a direction twisted with respect to the plane of paper, but the light actually detected by the detection optical system 21 is the diffracted light D12 diffracted by $\phi m$ in the W-direction, by the diffraction grating 10c as described above. Since the diffracted light D12 is diffracted in a direction orthogonal to the XY plane, considering that the diffracted light D12 is diffracted in the X-direction again corresponds to virtually considering the incident light IL11' and IL12' vertically introduced with respect to the XY plane. Thus, here, the incident light IL11' and IL12' equivalent to the diffracted light D12 obtained by diffracting IL11 and IL12 orthogonally to the XY plane in the W-axis direction will be used in the following description for ease of description.

IL11' and IL12' enter the diffraction gratings 10c and 11c from a direction orthogonal to the X-axis. As in the case of W-direction, considering the +/−1-order diffracted light, the diffracted light D14 diffracted in the diffracting grating 10c in the orders of +/−1, and the diffracted light D14 diffracted in the diffraction grating 11c in the order of −/+1 enters the detection optical system 21 at an angle $\phi\Delta$ expressed in Equation 8. Thus, a moiré stripe pattern having a period of P$\Delta$/2 is generated by the diffracted light D14.

Figure 12B:
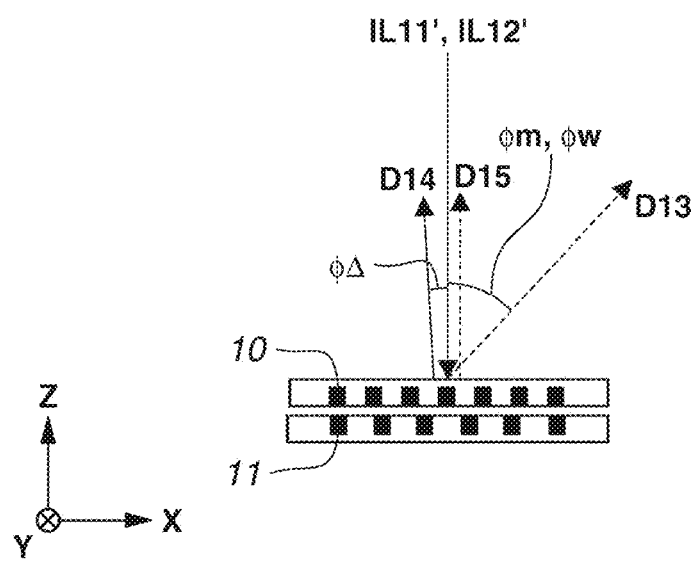

Next, the light diffracted once in any one of the diffraction grating 10c and the diffraction grating 11c exits at an angle $\phi m$ or $\phi w$ (D13 of FIG. 12B). Since D13 does not generate a moiré stripe pattern but becomes noise, the period of the diffraction grating and the detection unit 3 are adjusted to satisfy Equation 11 so that D13 cannot be detected by the detection optical system 21.

The light (zero-order diffracted light, D15 of FIG. 12B) which is not diffracted in the X-direction in any one of the diffraction grating 10c and the diffraction grating 11c is regularly reflected on the mold and the substrate to enter the detection optical system 21. Further, the diffracted light (in a total of zero-order) which are not diffracted in the diffraction grating formed in the substrate but are diffracted in +/−n-order and −/+n-order in the X-direction in the diffraction grating formed in the mold before and after being reflected on the substrate, respectively, also enters the detection optical system 21. Although the light lowers the contrast of the moiré stripe pattern without generating a moiré stripe pattern, since the diffraction grating 10c is a checkerboard shaped, the phases of the diffracted light from the adjacent gratings deviate from each other by π, causing the diffracted light to cancel each other. Thus, the intensity of D15 is restrained, the moiré stripe pattern can be measured with an excellent contrast.

Although the detection of the moiré stripe pattern for measuring a relative position of the mold and the substrate in the X-direction has been described, the detection of the moiré stripe pattern for measuring a relative position thereof in the Y-direction is basically the same except that the X-directions and the Y-directions of the diffraction gratings 10c and 11c are merely exchanged.

Figure 13A:
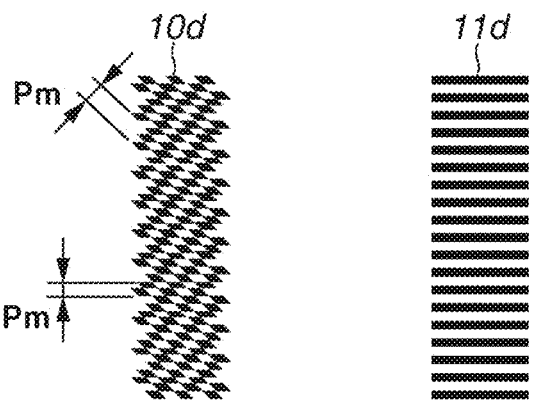
FIGS. 13A and 13B are views illustrating alignment marks in a Y-direction in the second exemplary embodiment of the present invention.
Figure 13B:
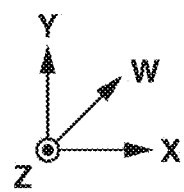

FIGS. 13A and 13B illustrate the diffraction grating 10d of the mold side alignment mark 10 and the diffraction grating 11d of the substrate side alignment mark 11, for detecting a relative position of the mold and the substrate in the Y-direction, respectively.

The mold side alignment mark 10 (sixth mark) is a checkerboard shaped diffraction grating 10d (sixth diffraction grating) having a periodic structure with periods Pm in each of the X-direction and the Y-direction. The substrate side alignment mark 11 (fourth mark) is the diffraction grating 11d (fourth diffraction grating) having a periodic structure with a period Pw different from the period Pm in the Y-direction. The moiré stripe pattern for detecting a relative position of the mold and the substrate in the Y-direction is generated by overlapping the diffraction gratings and illuminating the light with the poles IL11 and IL12.

Thus, the marks obtained by overlapping the diffraction gratings 10c and 10d with the diffraction gratings 11c and 11d, respectively as in FIG. 9 are detected by using the detection unit 3 having the illumination pupil distribution and the detection NA (NAo) as in FIG. 10. As illustrated in FIG. 9, as the alignment mark in the X-direction and the alignment mark in the Y-direction are disposed in the field 40 of the detection unit 3 at the same time, the moiré stripe patterns for the alignments in the X-direction and the Y-direction can be observed at the same time. In other words, in the position detection system according to the present exemplary embodiment, information regarding relative positions in two directions can be acquired by one detection unit 3 (the detection optical system 21 and the illumination optical system 22) at the same time.

Further, the position detection apparatus according to the present exemplary embodiment can generate moiré stripe patterns in the X-direction and the Y-direction with a common illumination pupil distribution. Since this can reduce the number of light intensity distributions arranged on the illumination pupil plane, the contrast of the moiré stripe pattern can be restrained from being lowered, for example, due to generation of a stray light, or the like. Accordingly, an alignment of the mold and the substrate can be carried out with a high precision.

Although the W-axis has been defined as a direction forming 45 degrees with each of the X-axis and the Y-axis in the present exemplary embodiment, the present invention is not limited thereto, but, for example, may be defined as a direction forming 40 degrees or 30 degrees with the X-axis. However, if the angles of the W-axis with respect to the X-axis and the Y-axis become different, the basic grating shapes of the diffraction gratings 10c and the diffraction grating 10d also become different. As a result, as the diffraction efficiencies of the diffraction grating 10c and the diffraction grating 10d become different, difference in the intensities or contrasts of the detected moiré stripe patterns is generated. Accordingly, there is a possibility of causing a difference between the alignment precisions in the X-direction and the Y-direction. It is useful that the W-axis is defined as a direction forming the same angle (45 degrees) with each of the two measurement directions (X-axis and Y-axis).

Further, although it has been described that the periods of the diffraction grating 10c and the diffraction grating 10d are the same and the periods of the diffraction grating 11c and the diffraction grating 11d are the same, the present exemplary embodiment is not limited thereto. Specifically, similarly to the first exemplary embodiment, the periods of the diffraction grating 10c and the diffraction grating 10d may be different from each other, and the periods of the diffraction grating 11c and the diffraction grating 11d may be different from each other.

An imprint apparatus according to a third exemplary embodiment will be described.

FIG. 14 is a schematic view illustrating a configuration of the imprint apparatus according to the present exemplary embodiment. The imprint apparatus 50 according to the present exemplary embodiment includes a projection optical system 12. The other configurations of the apparatus and an imprint processing method are basically the same as the imprint apparatus 1 described in the first exemplary embodiment.

The projection optical system 12 is arranged immediately above the mold 7, and images of the alignment mark 10 formed in the mold 7 and the alignment mark 11 formed in the substrate 8 are projected onto a projection plane 13 of the projection optical system 12.

Further, the projection optical system 12 includes a beam splitter 14 therewithin. The beam splitter 14 is an optical member for selectively reflecting or transmitting light according to a wavelength of the light, and for example, can be designed such that a UV light curing the resin 9 may be reflected and a visible ray or an infrared ray illuminating the alignment marks 10 and 11 may be transmitted. The beam splitter 24 may employ, for example, a dichroic mirror or a dichroic prism. FIG. 14 illustrates a case of the beam splitter 14 employing a dichroic mirror.

The irradiation unit 2 radiates a UV light to cure the resin 9 applied on the substrate 8 in the present exemplary embodiment. The irradiation unit 2 radiates light to the beam splitter 14 from a lateral direction of the projection optical system 12, and the light reflected on the beam splitter 14 transmits some of the projection optical system 12 to be radiated to the pattern 7a in a predetermined shape.

The detection unit 3 (position detection apparatus) illuminates the alignment marks 10 and 11 through the projection optical system 12 (and the beam splitter 14). A relative position of the mold and the substrate is detected by detecting an image of the moiré stripe pattern projected onto the projection plane 13 of the projection optical system 12. The detection unit 3 may be the detection unit described in the first exemplary embodiment, or may be the detection unit described in the second exemplary embodiment.

The beam splitter 14 may be configured to transmit a UV light and reflect a visible ray or an infrared ray. In this case, the detection unit 3 detects the light obtained by bending the diffracted light from the alignment mark with the beam splitter 14 of the projection optical system 12. In other words, as the irradiation unit 2 is arranged above the projection optical system 12, the locations of the detection unit 3 and the irradiation unit 2 are opposite to those of FIG. 14.

By configuring the apparatus in this way, there is no need to retreat the detection unit 3 when a UV light is radiated even if a detection unit 3 arranged such that the optical axis thereof is vertical to the mold and the substrate is used. A time for a retreatment of the detection unit 3 after an alignment mark is detected by the detection unit 3 becomes unnecessary. Accordingly, the productivity of the imprint apparatus can be enhanced.

Further, in the imprint apparatus 50 according to the present exemplary embodiment, a folding mirror 15 may be arranged in the vicinity of the projection plane 13 of the projection optical system 12. The illumination light illuminated from the detection unit 3 and the diffracted light from the alignment marks 10 and 11 are bent by the folding mirror 15 at a location where the luminous flux diameter is small in a direction parallel to the XY plane. Thus, even when the diameter of the detection unit 3 becomes larger by enlarging the NA of the detection optical system 21 or the illumination optical system 22 to enlarge a detection wavelength range or increase an amount of illuminated light, the degree of freedom of arrangement increases and the detection unit 3 can be arranged at a spatially available location. In addition, as the degree of freedom of arrangement of the detection unit 3 increases, the degrees of freedom of arrangement of the alignment marks 10 and 11 formed in the mold 7 and the substrate 8 can also increase.

When there is no projection optical system 12 according to the present exemplary embodiment, the detection unit 3 needs to avoid interference with a mold driving mechanism or a mold magnification calibrating mechanism configured in a mold holding unit 4. Accordingly, the detection unit 3 needs to be arranged at a location spaced apart from the mold 7 to some degree or the diameter thereof needs to be as small as possible. If the detection unit 3 is arranged at a location spaced apart from the mold 7, the detection unit 3 becomes larger to widen the luminous flux diameter thereof and there is a limit in a place where the detection unit 3 is disposed, making the degree of freedom of arrangement of the alignment mark lower.

Further, if the detection unit 3 is to be arranged such that the diameter thereof is small, as the NAs of the detection optical system 21 and the illumination optical system 22 become smaller, an amount of light illuminating the alignment mark is reduced and the bandwidth of the detected wavelength becomes narrower. As a result, a precision in the relative alignment between the mold and the substrate may be lowered.

By configuring the projection optical system 12 according to the present exemplary embodiment, the NA of the detection optical system 21 or the illumination optical system 22 of the detection unit 3 can be enlarged without worrying about an interference with the mold driving mechanism or the mold magnification calibrating mechanism or the restriction on the arrangement of the alignment marks 10 and 11. As a result, a detected wavelength range of the detection unit 3 can be enlarged and an amount of illuminated light can be increased. Further, a relative alignment of the mold and the substrate can be carried out with a high precision.

In addition, the detection unit (position detection apparatus) of the present invention is not limited to an imprint apparatus, and may be used in an apparatus for measuring a relative position of two objects to carry out an alignment. The two objects are not limited to the mold and the substrate only if a relative position of the two objects can be detected. In this case, the alignment mark 10 is formed in one of the two objects and the alignment mark 11 is formed in the other object. The detection unit needs to be arranged to detect the alignment marks at the same time.

A method for manufacturing a device (a semiconductor integrated circuit device, a liquid crystal display device, and the like) includes a process of forming a pattern on a substrate (a wafer, a glass plate, and a film substrate) by using the above-described imprint apparatus. Further, the method for manufacturing a device includes a process of etching the substrate where the pattern is formed. In addition, a method for manufacturing other articles such as a patterned media (recording medium) or an optical device may include another processing for machining instead of etching the substrate where the pattern is formed. The article manufacturing method according to the present exemplary embodiment is advantageous in at least one of a performance, a quality, a productivity, and manufacturing costs of an article as compared with a method according to the conventional technique.

Although the exemplary embodiments of the present invention have been described, the present invention is not limited thereto but may be changed and modified without departing from the spirit of the present invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-137820 filed Jun. 21, 2011, which is hereby incorporated by reference herein in its entirety.

What is claimed is:

1. A detection apparatus, comprising:
    an illumination optical system configured to illuminate a first diffraction grating having periods in each of a first direction and a second direction different from the first direction, and a second diffraction grating having a period different from the period in the second direction of the first diffraction grating in the second direction, at an oblique incidence; and
    a detection optical system configured to detect diffracted light from the first diffraction grating and the second diffraction grating,
    wherein the illumination optical system includes a first pole and a second pole which is in opposite side of the first pole with respect to an optical axis on a pupil plane thereof, and
    wherein the detection optical system detects the light diffracted by the first diffraction grating and the second diffraction grating by illuminating the first diffraction grating and the second diffraction grating with the light from the first pole and the second pole at an oblique incidence in the first direction radiated from the illumination optical system.

2. The detection apparatus according to claim 1, wherein when the period of the first diffraction grating in the first direction is P1, a size of the numerical apertures of the detection optical system on the pupil plane is NAo, a distance of the pole of the illumination optical system from the optical axis on the pupil plane is NAil1, a size of the pole is NAp1, and a wavelength of the light illuminated from the illumination optical system is λ, |NAil1−λ/P1|<NAo+NAp1/2 is satisfied.

3. The position detection apparatus according to claim 1, wherein the illumination optical system is configured to illuminate the first diffraction grating formed in the first object and a third diffraction grating having periodic structures in each of a first direction and a second direction,
wherein the illumination optical system is configured to illuminate the second diffraction grating formed in a second object and a fourth diffraction grating having a periodic structure having a period different from the period in the first direction of the third diffraction grating in a first direction, and
wherein the illumination optical system illuminates light comprising a plurality of poles in the second direction, on a pupil plane thereof, and
wherein the detection optical system is configured to detect the diffracted light from the first diffraction grating and the second diffraction grating, and diffracted light from the third diffraction grating and the fourth diffraction grating, and
wherein the detection optical system is configured, based on the detected result, to detect a relative position of the first object and the second object in the first direction and the second direction.

4. The detection apparatus according to claim 3, wherein when the period of the third diffraction grating in the second direction is P2, a size of the numerical apertures of the detection optical system on the pupil plane is NAo, a distance of the pole of the illumination optical system from the optical axis on the pupil plane is NAil2, a size of the pole on the pupil plane is NAp2, and a wavelength of the light illuminated from the illumination optical system is λ, |NAil2−λ/P2|<NAo+NAp2/2 is satisfied.

5. The detection apparatus according to claim 1, wherein the first direction and the second direction are orthogonal to each other.

6. The detection apparatus according to claim 4, wherein at least one of the periods of the first diffraction grating and the third diffraction grating in the first direction and the periods of the first diffraction grating and the third diffraction grating in the second direction is the same.

7. The detection apparatus according to claim 6, wherein the first diffraction grating and the third diffraction grating have the same periodic structure.

8. A detection apparatus, comprising:
an illumination optical system configured to illuminate a fifth diffraction grating having periods in each of a second direction and a third direction different from the second direction and a first directio perpendicular to the second direction, and a second diffraction grating having a period different from the period in the second direction of the fifth diffraction grating in the second direction, at an oblique incidence, and illuminate a sixth diffraction grating having periods in each of the third direction and the first direction and a fourth diffraction grating having a period different from the period in the first direction of the sixth diffraction grating in the first direction, at an oblique incidence; and
a detection optical system configured to detect diffracted light from the fifth diffraction grating and the second diffraction grating, and diffracted light from the sixth diffraction grating and the fourth diffraction grating,
wherein the illumination optical system includes a first pole and a second pole which is in opposite side of the first pole with respect to an optical axis on a pupil plane thereof,
wherein the detection optical system detects the light diffracted by the fifth diffraction grating and the second diffraction grating by illuminating the fifth diffraction grating and the second diffraction grating with the light from the first pole and the second pole at an oblique incidence in the third direction radiated from the illumination optical system, and
wherein the detection optical system detects the light diffracted by the sixth diffraction grating and the fourth diffraction grating by illuminating the sixth diffraction grating and the fourth diffraction grating with the light from the first pole and the second pole at an oblique incidence in the third direction radiated from the illumination optical system.

9. The detection apparatus according to claim 1, wherein optical axes of the illumination optical system and the detection optical system are partially common.

10. The detection apparatus according to claim 1, wherein at least one of the numerical apertures of the detection optical system, the light intensity distribution of the illumination optical system on a pupil plane, and a wavelength of the illumination light is variable.

11. The detection apparatus according to claim 3, wherein the diffraction grating formed in the first object is a checkerboard shaped diffraction grating.

12. The detection apparatus according to claim 1, wherein a relative position of the first diffraction grating and the second diffraction grating in the second direction is obtained based on the detected diffracted light.

13. The detection apparatus according to claim 1, wherein the first pole and the second pole are in a symmetrical position with respect to the optical axis.

14. The detection apparatus according to claim 1, wherein the first pole and the second pole are light intensity distribution peaks.

15. The detection apparatus according to claim 1, wherein the illumination optical system forms annular-shaped light intensity distribution on the pupil plane thereof and the annular-shaped light intensity distribution includes the first pole and the second pole in the first direction.

16. The detection apparatus according to claim 1, wherein the detection optical system detects a moire stripe pattern generated due to the diffraction light from the first diffraction grating and the second diffraction grating.

17. The detection apparatus according to claim 8,
wherein a relative position of the fifth diffraction grating and the second diffraction grating in the second direction is obtained based on the detected diffraction light from the fifth diffraction grating and the second diffraction grating, and
wherein a relative position of the sixth diffraction grating and the fourth diffraction grating in the first direction is obtained based on the detected diffraction light from the sixth diffraction grating and the fourth diffraction grating.

18. A detection apparatus, comprising:
an illumination optical system configured to illuminate a first diffraction grating having periods in each of a first direction and a second direction different from the first direction, and a second diffraction grating having a period in a second direction different from the period of the first diffraction grating in the second direction, at an oblique incidence, and illuminate a third diffraction grating having periods in each of the first direction and the second direction, and a fourth diffraction grating having a period different from the period of the third diffraction grating in the first direction, at an oblique incidence; and a detection optical system configured to detect diffracted light from the first diffraction grating and the second diffraction grating, and diffracted light from the third diffraction grating and the fourth diffraction grating, wherein the illumination optical system includes a first pole and a third pole on a pupil plane thereof, wherein the detection optical system detects the light diffracted by the first diffraction grating and the second diffraction grating by illuminating the first diffraction grating and the second diffraction grating with the light from the first pole at an oblique incidence in the first direction radiated from the illumination optical system, and wherein the detection optical system detects the light diffracted by the third diffraction grating and the fourth diffraction grating by illuminating the third diffraction grating and the fourth diffraction grating with the light from the third pole at an oblique incidence in the second direction radiated from the illumination optical system.

19. The detection apparatus according to claim 18, wherein the illumination optical system includes the first pole and a second pole which is in opposite side of the first pole with respect to an optical axis on the pupil plane thereof.

20. The detection apparatus according to claim 18, wherein the illumination optical system includes the third pole and a fourth pole which is in opposite side of the third pole with respect to an optical axis on the pupil plane thereof.

21. The detection apparatus according to claim 18,
wherein a relative position of the first diffraction grating and the second diffraction grating in the second direction is obtained based on the detected diffracted light from the first diffraction grating and the second diffraction grating, and wherein a relative position of the third diffraction grating and the fourth diffraction grating in the first direction is obtained based on the detected diffracted light from the third diffraction grating and the fourth diffraction grating.

* * * * *